US009329609B1

(12) United States Patent
Goyal et al.

(10) Patent No.: US 9,329,609 B1
(45) Date of Patent: May 3, 2016

(54) FEEDBACK BASED TOPOLOGY FOR SYNCHRONIZATION OF MULTI-VOLTAGE DOMAIN SIGNALS IN DIFFERENTIAL DRIVERS

(71) Applicant: NXP B.V., Eindhoven (NL)

(72) Inventors: Shishir Goyal, Bangalore (IN); Arnoud van der Wel, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/661,151

(22) Filed: Mar. 18, 2015

(51) Int. Cl.
*H03K 5/22* (2006.01)
*G05F 1/46* (2006.01)

(52) U.S. Cl.
CPC .................................... *G05F 1/46* (2013.01)

(58) Field of Classification Search
USPC .................................. 327/3, 5, 12, 63–65, 67
See application file for complete search history.

(56) References Cited

U.S. PATENT DOCUMENTS 4,951,000 A * 8/1990 Dautriche .............. H03H 11/20 327/236
5,838,193 A * 11/1998 Myers .................. H03F 3/2171 330/10

OTHER PUBLICATIONS

TJA1044—High-speed CAN transceiver with Standby mode, Rev. 3-19; NXP Semiconductors; product data sheet, Nov. 19, 2014, 1-21.

* cited by examiner

*Primary Examiner* — An Luu

(57) ABSTRACT

Disclosed is a differential driver circuit including an input module to receive an input signal and split the input signal into high and low components, a first level shifter to receive the high signal component and output a high side input signal to a high side driver, a delay module to receive the low signal component and output a low side input signal to a low side driver, and a multi-voltage domain phase detector to measure a phase difference between the high side input signal and the low side input signal to provide feedback to the input module and output a phase adjusted output signal to match a first delay timing of the first level shifter.

17 Claims, 3 Drawing Sheets

FEEDBACK BASED TOPOLOGY FOR SYNCHRONIZATION OF MULTI-VOLTAGE DOMAIN SIGNALS IN DIFFERENTIAL DRIVERS

TECHNICAL FIELD

Differential drivers are circuits that include a high side driver and a low side driver to respectively generate equal and opposite signals of different voltages. These drivers may be used in differential voltage applications to provide maximum symmetry between two driver halves of a circuit. Low electromagnetic emission is desired. Circuits such as these find use in automotive networks, including a controller area network ("CAN") bus, Flexray, Automotive Ethernet, and other standards. Class D amplifiers may also make use of differential driver topology having varied voltage signals because class D amplifiers use a power supply voltage to drive low side transistors and a voltage above the power supply voltage to drive high side transistors of the class D power stage.

SUMMARY

A brief summary of various embodiments is presented below. Some simplifications and omissions may be made in the following summary, which is intended to highlight and introduce some aspects of the various embodiments, but not to limit the scope of the embodiments described herein. Detailed descriptions of embodiments adequate to allow those of ordinary skill in the art to make and use the inventive concepts will follow in later sections.

According to one embodiment, there may be provided a differential driver circuit, including an input module to receive an input signal and split the input signal into high and low components, a first level shifter to receive the high signal component and output a high side input signal to a high side driver, a delay module to receive the low signal component and output a low side input signal to a low side drive, and a multi-voltage domain phase detector to measure a phase difference between the high side input signal and the low side input signal to provide feedback to the input module and output a phase adjusted output signal to match a first delay timing of the first level shifter.

The multi-voltage domain phase detector may include second and third level shifters. Second and third level shifters may be capacitive level shifters.

The capacitive level shifter may include components that cause a second delay.

The second delay may be independent of a power supply value of the capacitive level shifter.

The capacitive level shifter may include a plurality of capacitors.

The capacitive level shifter may include a plurality of inverters.

The second and third level shifters may output respective signals in a same voltage domain.

The multi-voltage domain phase detector may include a time-to-digital converter to output a phase error between the respective signals.

According to another embodiment, there may be provided a driver feedback circuit including a digital generation input module to receive an input signal and a feedback signal and output a plurality of output signals, a first level shifter to receive one of the plurality of signals and output a high side input signal to a high side driver, a delay module to receive another of the plurality of signals and output a low side input signal to a low side driver, a multi-voltage domain phase detector to receive the high side input signal and the low side input signal, detect a phase difference between a high side input signal and a low side input signal and output the feedback signal to the digital generation input module, wherein the multi-voltage domain phase detector comprises a capacitive level shifter to level shift a portion of the high side input signal to be in a same voltage domain as the low side input signal in order to measure a phase difference between the high side input signal and the low side input signal.

The multi-voltage domain phase detector may include a second level shifter wherein the capacitive level shifter and the third level shifter output the same voltage domain signals to a time-to-digital converter.

The capacitive level shifter may include a plurality of capacitors and receives a supply voltage wherein an input to output signal propagation delay is independent of a value of the supply voltage.

The circuit may include an up-down counter to receive an output from the time-to-digital converter to The capacitor level shifter may include high side input inverters and a low side latch.

The high side input inverters may operate between a supply voltage and a supply voltage less a set low voltage.

The low side latch may operate between a set low voltage and ground.

The capacitive level shifter may include a plurality of capacitors between the high side input inverters and the low side latch.

BRIEF DESCRIPTION OF THE DRAWINGS

Embodiments discussed herein are described in more detail and by way of non-limiting examples with reference to the accompanying drawings, wherein.

DETAILED DESCRIPTION

Figure 1:
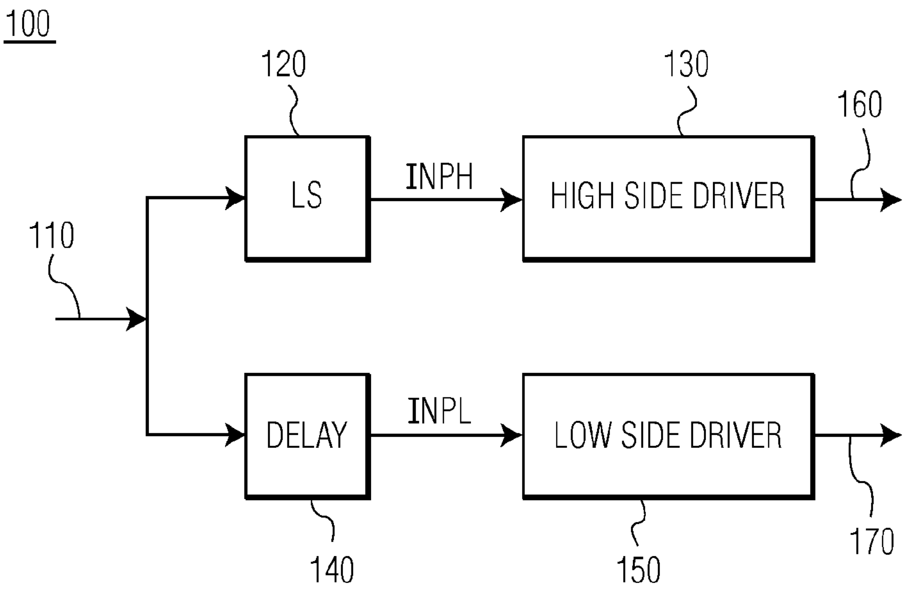
FIG. 1 illustrates a block diagram of an output stage of a differential driver circuit in accordance with an embodiment.

Reference is made herein to the attached drawings. Like reference numerals are used throughout the drawings to depict like or similar elements described herein.

In embodiments described herein, circuit designs seek to enhance clock synchronization between different voltage domains for many types of circuit applications, not being limited to those using differential line drivers. One application could be a differential line driver for a network, such as used in transverse transceivers. Other applications could include class D power amplifiers and digital circuits within a digital logic domain.

FIG. 1 illustrates a block diagram of an output stage of a differential driver circuit 100 in accordance with an embodiment. Under the control of a microprocessor, the circuit 100 receives an input signal 110 such as a clock signal, a pulse width modulated (PWM signal) for Class D amplifiers, or a data signal for CAN transmitters, etc. Input signal 110 may be divided into two portions to be used by high and low voltage components.

The circuit 100 includes a level shifter ("LS") 120 to increase the voltage level of input signal 100 to a higher voltage domain. In high voltage circuits and applications, input signal 110 may be level shifted by LS 120 before being input to a high side driver 130. The level shifted component of input signal 110 may be referred to as a high side input signal ("INPH"). The high side driver 130 can be used to control power delivery for high voltage applications.

Because of components included in the LS 120, the LS 120 may cause a timing delay in the signal INPH that is output to the high side driver 130. Because bus circuits, for example, require symmetrical timing for outputs from the differential driver circuit 100, a delay of the LS 120 may be compensated for. In an embodiment, a delay component 140 can be implemented to match the timing delay of the level shifter 120. The delay component 140 may produce a low side input signal ("INPL"), representing a low-side input to a low side driver 150. Without more control of input and intermediate signals, this circuit can produce varied results.

Embodiments described herein synchronize high side input signals INPH and a low side input signals INPL. Non-synchronization of the signals can create a timing mismatch between INPH and INPL that can lead to unwanted electromagnetic ("EM") emissions. Such emissions can interfere with surrounding systems such as radio receivers and other electronic load components. In embodiments described herein, differential drivers with maximum symmetry between the two driver halves results in low EM emission. Implementations of embodiments described herein can be applied wherever accurate synchronization is required between clocks/signals in different voltage domains.

Embodiments described herein provide for synchronization of clocks that are in different voltage domains. A high clock may be in the 3.2V to 5V domain. A lower clock may be in the 0 to 1.8V domain. These voltage ranges are not limited. A low voltage domain can be between ground and 1.1V, 1.2V, or 1.8V, etc., depending on the core voltage of an intended process. A high side domain can have a similar 1.1, 1.2 or 1.8, etc. voltage range, but be used in much higher operating conditions such as between 10V and 11V, or 20V and 21V, or 100V and 101V, etc.

With an input clock signal, embodiments described herein produce INPL and INPH exactly in phase, such that respective high side and low side output waveforms 160 and 170 illustrated in FIG. 1 are exactly matched. That is, output signals 160 and 170 should be equal and opposite. Embodiments described herein are useful in circuits that have very strict limits, such as those for CAN transceivers. Emissions are desired to be kept within certain limits. Mismatches can create common mode voltages, causing unwanted emissions from the driver circuit 100.

To implement a delay circuit that is dutifully matched to the delay of the level shifter 120 is very challenging because delays in the level shifter 120 and in the dummy delay module 140 are unsteady and vary as processing, temperature, and other factors. Embodiments described herein will provide a circuit design and implementation to achieve these goals.

Figure 2:
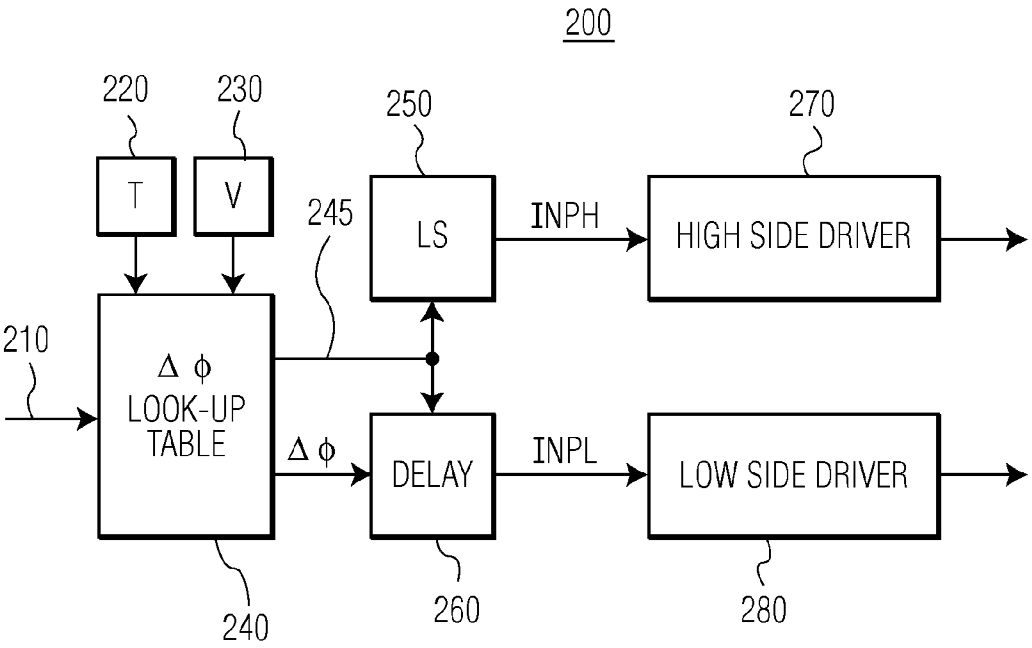
FIG. 2 illustrates a block diagram of a feed-forward system to synchronize high side input and low side input in accordance with an embodiment.

FIG. 2 illustrates a block diagram of a feed-forward circuit 200 to synchronize high side input (INPH) and low side input (INPL) in accordance with an embodiment.

A feed forward circuit 200 as illustrated in FIG. 2 may include a temperature sensor 220 that outputs a temperature signal (Tsense) based on temperature and a supply voltage sensor 230 that outputs a supply signal (Vdd sense) based on supply voltage. Output signal Tsense from temperature sensor 220 and output signal Vdd sense from voltage sensor 230 are input into a circuit module 240 that uses a digital phase change ("Δϕ") generation lookup table.

In the circuit design illustrated in FIG. 2, a challenge is to make a timing delay for a variable delay module 260 that tracks the delay of a level shifter 250 over all of temperature ranges and supply voltages. Module 240 may receive input clock signal 210 and look up values corresponding to the measured values of Tsense and Vdd sense to render a manipulated signal Δϕ. Values from the look up table used with module 240 are used to provide a signal to be output to variable delay module 260. Module 260 receives this measured value and a modified input signal 245 and attempts to compensate for the delay produced by LS 250. Level shifter 250 receives a representation 245 of input signal 210. By the implementation of these modules, symmetrical signals can be input and processed by respective high side driver 270 and low side driver 280.

FIG. 2 illustrates a representation of level shifter 250 translating a signal from a low side domain to the high side domain. Although this topology provides beneficial results, it can require process variations that are trimmed at the wafer level and can be cost intensive. Temperature sensor 220 and voltage sensor 230 can take up extra die area and consume extra power. Temperature sensor 220 and a supply sensor 230 are also included in the same substrate as the driver circuitry, and can cause interference and other unwanted characteristics.

In FIG. 2, an open loop approach senses circuit temperature and supply voltages and compensating these elements to determine delay rates to synchronize INPH and INPL. However, such an arrangement can make the circuit more complicated and expensive. The Δϕ generation table of module 240 will also be calculated and filled, which can be time consuming.

Embodiments described herein provide a feedback based system to synchronize the high side and the low side signals in differential transmitters and other circuits. The high side and low side signals are generally in different voltage domains. The system includes a capacitive voltage level shifter ("CLS") whose delay is independent of supply voltage variations.

Figure 3:
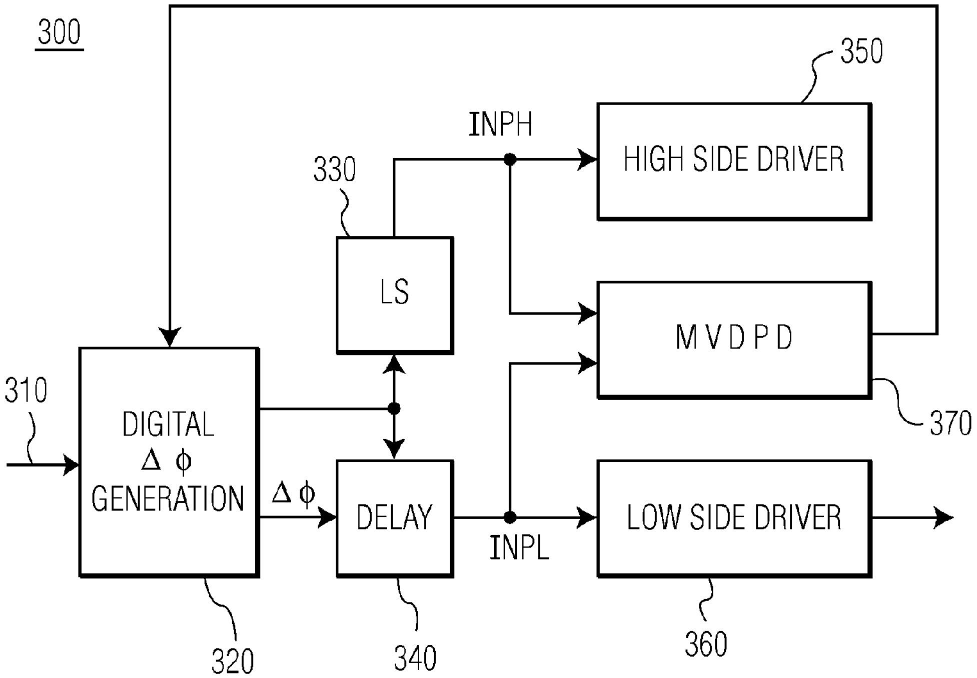
FIG. 3 illustrates a block diagram of a feedback system to synchronize a high side clock and a low side input in accordance with an embodiment.

FIG. 3 illustrates a block diagram of a feedback system 300 to synchronize a high side clock and a low side input according to an embodiment. In the circuit illustrated in FIG. 3, an input clock signal or data signal 310 may be input into digital phase shift generation module 320 and output to level shifter 330 and variable delay module 340. Level shifter 330 and variable delay module 340 are similar modules to those described herein. The feedback system 300 includes a high side driver module 350 and low side driver module 360 to respectively drive high voltage and low voltage components of a given system. Signal dividers (not illustrated) divide INPH and INPL into component parts that route the first representation of INPH to high side driver module 350 and a second part thereof to a Multi-Voltage Domain Phase Detector ("MVDPD") 370. A second signal driver (not illustrated) similarly divides INPL into two components, one for MVDPD 370 and a second to low side driver module 360.

FIG. 3 illustrates a closed loop system. In this embodiment, phase differences between INPH and INPL may be measured by MVDPD 370. On the basis of a measured phase difference between INPH and INPL, the phase Δϕ is corrected to adjust the delay timing of the delay module 340. As a result of that correction, the phase difference between INPL and INPH will tend towards 0, eliminating electromagnetic emissions and providing for a more efficient circuit.

Figure 4:
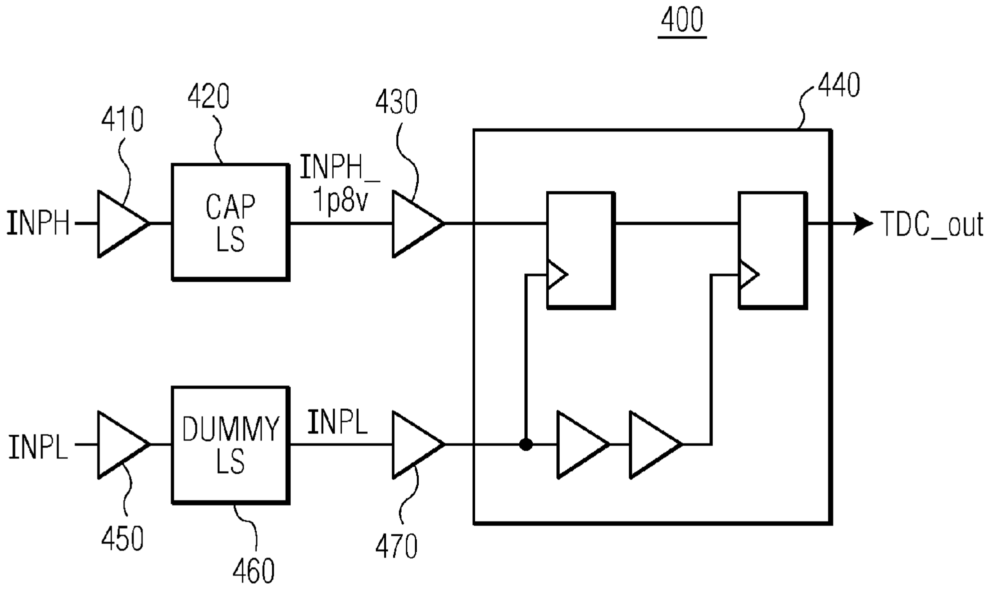
FIG. 4 illustrates a circuit diagram of a multi-voltage domain phase detector in accordance with FIG. 3.

FIG. 4 illustrates a circuit diagram for MVDPD 400, illustrated as module 370 in FIG. 3. On a high side of MVDPD 400, input signal INPH is input to an inverter 410 followed by a capacitive coupled level shifter ("CLS") 420. An output from CLS 420 enters a buffer element 430 and is input to a 1-bit time-to-digital converter ("TDC") circuit 440. On a low side of MVDPD 400, INPL signal output from the delay module 340 in FIG. 3 is input through a buffer element 450, through a dummy CLS module 460 becoming a delayed INPL, through buffer element 470, and output to the TDC circuit 440. Module 460 may have be configured in a similar manner as CLS 420 and programmed to output a low signal.

Figure 6:
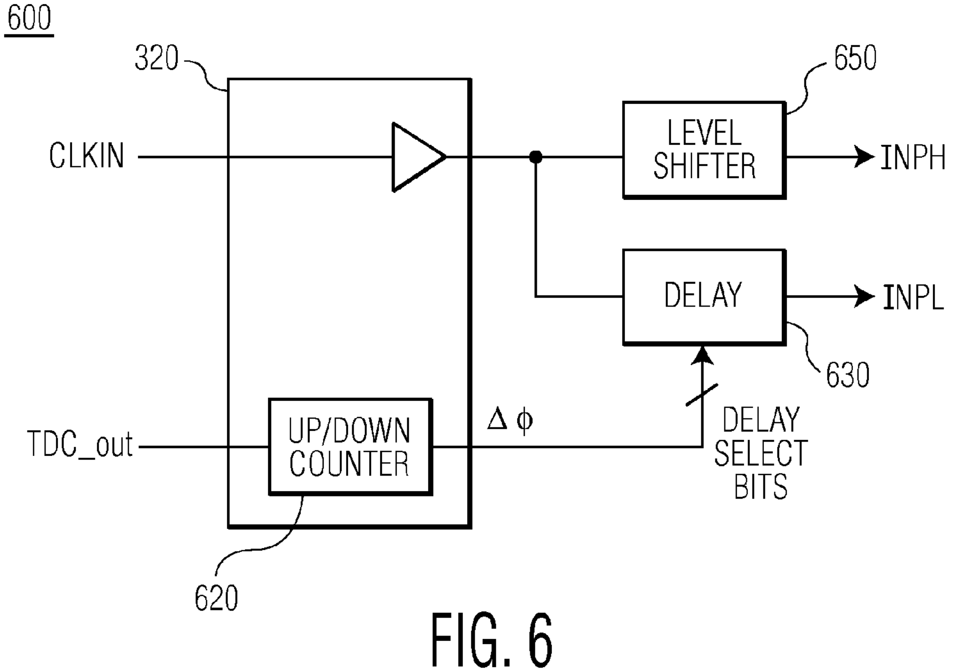
FIG. 6 illustrates a block diagram of a delta phi phase delay generation counter in accordance with an embodiment.

CLS 420 may receive INPH and shift the level of the signal down to the low side supply domain before the signals can be meaningfully processed by components of the MVDPD 400 and determine a phase difference between the two signals. Thus, after the INPH signal is shifted up and output from the level shifter 330 illustrated in FIG. 3, a portion of the up-shifted INPH signal is level-shifted down to the low voltage domain by using a CLS, as illustrated in FIG. 6 to be compared with INPL.

The INPH and INPL signal levels are brought closer together in voltage so that the circuit can work properly. The TDC 440 operates in a single supply domain. Thus the signals coming through a different supply domain, INPH in this case, may be shifted down to a lower level first before they can be processed by the TDC circuit 440.

Figure 5:
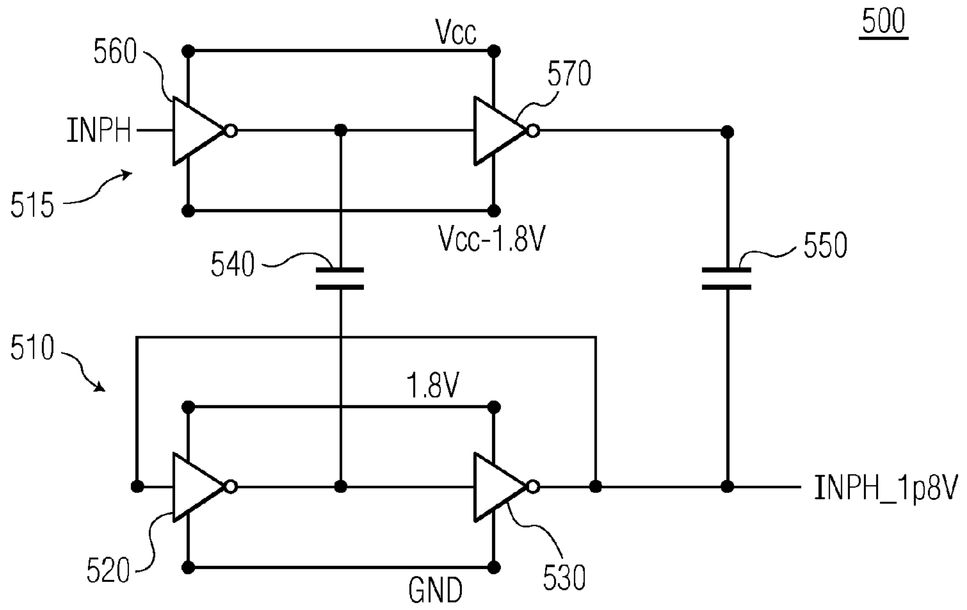
FIG. 5 illustrates a circuit diagram of a capacitive level shifter in accordance with FIG. 4.

FIG. 5 illustrates a circuit diagram for a CLS 500 in accordance with FIG. 4 and embodiments described herein. As illustrated in FIG. 5, a lower voltage domain latch 510 formed by dual inverters 520 and 530 is triggered by INPH through the capacitors 540 and 550, and operates between a low voltage and ground. A high side input circuit 515 may include inverters 560 and 570, and operate between Vcc and Vcc−the low voltage, as illustrated in FIG. 5 to be 1.8V, though embodiments are not limited thereto. At the high side, a latch is not present. The two inverters 560 and 570 provide input to a low side latch 510 through capacitors 540 and 550. The two input inverters 560 and 570 provide a 'push-pull' input to the latch 510 to make the CLS 500 more robust and fast.

Regardless of the high side INPH voltage level, the low side latch 510 will output a dropped down output voltage INPH signal at 1.8V, denoted by INPH_1p8V. Parasitic diodes in the transistors of inverters 520 and 530 ensure that the voltages at circuit nodes may be within reliability limits. Thus, the output signal labeled INPH_1p8V is the level shifted version of INPH with some finite phase shift due to the delay of the level shifter 500. This finite delay of the level shifter 500 is compensated by placing dummy level shifter delay 460 (illustrated in FIG. 4) in the path of INPL to generate a delayed INPL.

As illustrated in FIG. 5, a lower domain is set between GND and 1.8V. Lower inverters have a supply voltage of 1.8V. The high side domain has a voltage range between Vcc and Vcc−1.8V. The inverters operate independently of the supply domain they are in and see the voltage difference between their local ground and their local supply, which is comfortably 1.8 volts, 1.2 volts, 1.1 volts, etc., depending on the circuit design.

The CLS 500 illustrated in FIG. 5 is a component of the MVDPD of in FIG. 4. CLS 500 has several properties discussed below. By using the CLS 500 in the architecture of FIG. 4, good use is made of all of its properties. The circuit of FIG. 3 is further designed to take advantage of the characteristics of CLS 500.

In CLS 500 an input to output propagation delay is completely independent of the value of Vcc. This is the case because there is only capacitive coupling between the input and the output. When Vcc is constant with respect to time, the voltage on the capacitors does not factor into the output.

A delay is created in CLS 500 starting from the node INPH, traversing the inverters 560, 570 and capacitors 540, 550 to trigger the low side latch. The inverters 560,570 and the latch 510 will add time to the delay. Delay is usually a parasitic property of a level shifter. In this case, the delay does not negatively affect the operation of the MVDPD 370.

In the CLS 500 illustrated in FIG. 5, a first clock cycle becomes insignificant in terms of the operation of the circuit in FIG. 3. Prior to the first clock cycle, the output of the CLS 500 is ill-defined, not knowing what the output is going to be until the input has made exactly one cycle. The circuit of FIG. 3 has been designed with this property of CLS 500 taken into consideration.

The CLS 500 begins to work at a second cycle. An error in the first cycle may create a timing mismatch between INPH and INPL only in that cycle. INPH and INPL will begin to synchronize from a second cycle onwards. Because emissions are measured as average power over hundreds of cycles this initial state is insignificant to the circuit.

As illustrated in FIGS. 3 and 5, using the CLS 500 of the MVDPD 360, the LS 340 may receive feedback that is used to correct timing between INPH and INPL. After every cycle of the input signal, a comparison is made between INPL and INPH in the MVDPD 370 and a conclusion is drawn as to the phase difference.

As illustrated in FIG. 4, level shifted INPH_1p8V is output from CLS 420 to be at a same voltage level as INPL. INPH_1p8V is phase compared with INPL using a 1-bit TDC 440. The output of TDC 440 and thus MVDPD 400 of FIG. 4 is a TDC_out signal that registers as High (1) when INPH_1p8V leads INPL and registers as Low (0) when INPL leads INPH_1p8V. TDC_out represents a polarity of a phase error between INPH_1p8V and INPL and is used in the feedback system described herein.

As illustrated in FIGS. 4 and 6, TDC_out from TDC 440 is input to an up/down ("UD") counter 620 that is part of the digital phase change generation module 320. When the phase error from TDC 440 registers as High, the counter 620 counts up. When the phase error from TDC 440 registers as Low, the counter 620 counts down. The UD counter 620 is thus an integrator, used to obtain a steady-state error of zero in the feedback loop. The output of the UD counter 620 is then fed back into a variable delay component to adjust a delay of the INPL signal. This is closed loop delta phi generation. A net result of the closed loop will be such that a phase difference between INPH and INPL will tend towards 0.

Ultimately the output of the UD counter 620 will stabilize at the correct value and adjust as the parameters of the circuit change. Variations such as temperature, voltage, etc. will be fed back to adjust the delay value. Depending upon a bit resolution from TDC_out, the delay parameter may oscillate back and forth about the perfect value.

As illustrated in FIG. 6, the UD counter 620 may increase or decrease delay depending on the TDC output. The UD counter output oscillates around the exact value at which phase difference between INPH and INPL is zero. The long term average of the counter output is also equal to this value.

FIG. 6 illustrates a block diagram for a delta phi phase delay generation counter in accordance with an embodiment. FIG. 6 illustrates an abstraction 600, an interpretation of the circuit of FIG. 3. An output from UD counter 620 is fed back into a variable delay component 630, which is analogous to delay component 340 illustrated in FIG. 3. A CLKIN signal is received through a buffer and then divided into high and low components to be input to level shifter 650, analogous to level shifter 330 of FIG. 3, and delay element 630. Variable delay 630 produces an adjusted INPL signal that is symmetrical with INPH and can be used with low side drivers. INPH and INPL thus represent the desired phase symmetrical signals, producing little to none electromagnetic emissions.

The CLS discussed herein has a property of an undefined initial state. A defined state will start from the second transition of INPH. This feature of the CLS affects the timing error in just one transmitted bit and does not significantly affect emissions. This property also makes this level shifter unsuitable for use in system shown in FIG. 1 because an undefined initial state can cause system to transmit an incorrect bit. A desirable property of embodiments described herein, therefore, is to use the benefits of the CLS to maximum effect. The CLS has a delay that is completely independent of the DC voltage shift between input and output, while at the same time, it conveniently circumvents the major drawback of not having a well defined initial state at the output. The timing loop proposed herein provides an optimal system architecture for the use of the capacitive level shifter.

It should be noted that the above-mentioned embodiments illustrate rather than limit the embodiments described herein, and that those skilled in the art will be able to design many alternative embodiments without departing from the scope of the appended claims. The word "comprising" does not exclude the presence of elements or steps other than those listed in a claim. The word "a" or "an" preceding an element does not exclude the presence of a plurality of such elements. The embodiments described herein can be implemented by means of hardware including several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A differential driver circuit, comprising:

an input module to receive an input signal and split the input signal into high and low components;

a first level shifter to receive the high signal component and output a high side input signal to a high side driver;

a delay module to receive the low signal component and output a low side input signal to a low side driver; and a multi-voltage domain phase detector to measure a phase difference between the high side input signal and the low side input signal to provide feedback to the input module and output a phase adjusted output signal to match a first delay timing of the first level shifter.

2. The circuit of claim 1, wherein the multi-voltage domain phase detector comprises second and third level shifters.

3. The circuit of claim 2, wherein the second and third level shifters are capacitive level shifters.

4. The circuit of claim 3, wherein the capacitive level shifter comprises components that cause a second delay.

5. The circuit of claim 4, wherein the second delay is independent of a power supply value of the capacitive level shifter.

6. The circuit of claim 4, wherein the capacitive level shifter comprises a plurality of capacitors.

7. The circuit of claim 4, wherein the capacitive level shifter comprises a plurality of inverters.

8. The circuit of claim 2, wherein the second and third level shifters output respective signals in a same voltage domain.

9. The circuit of claim 8, wherein the multi-voltage domain phase detector comprises a time-to-digital converter to output a phase error between the respective signals.

10. A driver feedback circuit, comprising:

A digital generation input module to receive an input signal and a feedback signal and output a plurality of output signals;

a first level shifter to receive one of the plurality of signals and output a high side input signal to a high side driver;

a delay module to receive another of the plurality of signals and output a low side input signal to a low side driver;

a multi-voltage domain phase detector to receive the high side input signal and the low side input signal, detect a phase difference between a high side input signal and a low side input signal and output the feedback signal to the digital generation input module; and wherein the multi-voltage domain phase detector comprises a capacitive level shifter to level shift a portion of the high side input signal to be in a same voltage domain as the low side input signal in order to measure a phase difference between the high side input signal and the low side input signal.

11. The circuit of claim 10, the multi-voltage domain phase detector comprising a second level shifter wherein the capacitive level shifter and the third level shifter output the same voltage domain signals to a time-to-digital converter.

12. The circuit of claim 11, wherein the capacitive level shifter comprises a plurality of capacitors and receives a supply voltage wherein an input to output signal propagation delay is independent of a value of the supply voltage.

13. The circuit of claim 11, comprising an up-down counter to receive an output from the time-to-digital converter to increase or decrease a delay depending on the output of the time-to-digital converter.

14. The circuit of claim 11, wherein the capacitor level shifter comprises high side input inverters and a low side latch.

15. The circuit of claim 14, wherein the high side input inverters operate between a supply voltage and a supply voltage less a set low voltage.

16. The circuit of claim 14, wherein the low side latch operates between a set low voltage and ground.

17. The circuit of claim 14, wherein the capacitive level shifter comprises a plurality of capacitors between the high side input inverters and the low side latch.

* * * * *